United States Patent
Theil et al.

(10) Patent No.: US 6,436,488 B1
(45) Date of Patent: Aug. 20, 2002

(54) CHEMICAL VAPOR DEPOSITION METHOD FOR AMORPHOUS SILICON AND RESULTING FILM

(75) Inventors: Jeremy A Theil, Mountain View; Gerrit J Kooi, Sunnyvale, both of CA (US); Ron P Varghese, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 31 days.

(21) Appl. No.: 09/591,815

(22) Filed: Jun. 12, 2000

(51) Int. Cl.⁷ ................................................ H05H 1/24
(52) U.S. Cl. .................... 427/578; 427/534; 427/307
(58) Field of Search ................ 427/578, 574, 427/534, 307

(56) References Cited

U.S. PATENT DOCUMENTS

| | | | |
|---|---|---|---|
| 4,792,460 A | * 12/1988 | Chu et al. | 427/578 |
| 5,082,696 A | * 1/1992 | Sharp | 427/248.1 |
| 5,126,169 A | * 6/1992 | Ishihara et al. | 427/578 |
| 5,338,580 A | * 8/1994 | Katagiri et al. | 427/578 |
| 5,420,044 A | * 5/1995 | Kozuka | 427/578 |
| 5,589,233 A | * 12/1996 | Law et al. | 427/578 |
| 5,645,947 A | * 7/1997 | Hirooka et al. | 427/578 |
| 5,648,293 A | 7/1997 | Hayama et al. | |

OTHER PUBLICATIONS

Akihisa Matsuda, "Plasma and Surface Reactions for Obtaining Low Defect Density Amorphous Silicon at High Growth Rates," J. Vac. Sci. Technol. A 16(1), pp. 365–368, Jan./Feb. 1998.

Toshihiro Kamei & Akihisa Matsuda, "Deposition of Ultra-pure Hydrogenated Amorphous Silicon," J. Vac. Sci. Technol. A 17(1), pp. 113–120, Jan./Feb. 1999.

Jeremy Theil, Dale Lefforge, Gerrit Kooi, Min Cao, Gary W. Ray, Hewlett–Packard Company; Mid–Gap States Measurements of Low–Level Boron–Doped a–Si:H Films; Journal of Non–Crystalline Solids 266–269 (2000); pp. 569–573.

* cited by examiner

Primary Examiner—Bret Chen

(57) ABSTRACT

Method of depositing a layer of amorphous silicon film on a substrate at a very fast deposition rate while maintaining superior film quality. A plasma volume in a process chamber is defined. A total flow rate of a mixture of gases introduced into the chamber is also defined. The total flow rate is the sum of the flow rates of the respective gases in the mixture. Next, a process parameter that includes the plasma volume and total flow rate is defined. The process parameter is then maintained in a first predetermined relationship with a predetermined value during the deposition of the amorphous silicon film.

21 Claims, 4 Drawing Sheets

CHEMICAL VAPOR DEPOSITION METHOD FOR AMORPHOUS SILICON AND RESULTING FILM

FIELD OF THE INVENTION

The present invention relates generally to chemical vapor deposition processes, and more specifically, to a chemical vapor deposition method for amorphous silicon and the resulting film.

BACKGROUND OF THE INVENTION

A plasma-enhanced chemical vapor deposition (PECVD) process is a process widely used in the manufacture of semiconductor devices for depositing layers of electronic materials on various substrates. In a PECVD process, a substrate is placed in a vacuum deposition chamber equipped with a pair of parallel plate electrodes or other means of coupling electrical energy into the chamber, such as a helical coil. The substrate is generally mounted on a susceptor which is also the lower electrode. A flow of a reactant gas is provided in the deposition chamber through a gas inlet manifold which also serves as the upper electrode. A radio frequency (RF) voltage is applied between the two electrodes which generates RF power sufficient to cause the reactant gas to form a plasma. The plasma causes the reactant gas to vigorously react and deposit a layer of the desired material on the surface of the substrate body. Additional layers of other electronic materials can be deposited on the first layer by providing in the deposition chamber a flow of a reactant gas containing the material of the additional layer to be deposited. Each reactant gas is subjected to a plasma which results in the deposition of a layer of the desired material.

The plasma-enhanced chemical vapor deposition (PECVD) process can be utilized to deposit an amorphous silicon film that can be used in a variety of different applications. One such application is the manufacture of amorphous silicon-based circuit elements where the deposition of a-Si:H film on the silicon wafer is first necessary.

Unfortunately, it is difficult to produce good quality hydrogenated amorphous silicon (a-Si:H) films at high deposition rates to achieve manufacturing efficiency and high throughput. For example, in order to produce good quality films, a typical deposition rate used by conventional processes in the industry is approximately 1 to 10 Angstroms/s. At such a low deposition rate, the substrate manufacturing process is very inefficient. For example, it may take two to three hours just to deposit a one micron thick a-Si:H film at these low deposition rates. As can be appreciated, these slow process times are unacceptable for high volume integrated circuit manufacturing. However, when the deposition rate is increased, conventional processes produce films of unacceptable quality.

There have been some attempts to produce high quality amorphous silicon and to improve growth rates. One such study was reported by A. Matsuda in the J. Vac. Sci. Technol. A., Vol. 16, No. 1, January/February 1998 in an article entitled, "Plasma and Surface Reactions for Obtaining Low Defect Density Amorphous Silicon at High Growth Rates." This publication recites from a plasma chemistry perspective some of the basic mechanisms that create a-Si:H films and provides some general comments regarding maintaining an "adequate flow rate of silane" and "reducing the partial pressure of silane." Unfortunately, the publication neither recites nor suggests concrete experimental results as to the deposition rate and the quality of the resultant amorphous silicon film. In addition, there is no suggestion or teaching regarding the specific process conditions or process details that can be utilized in a manufacturing process. Consequently, it would be desirable for there to be specific details on how to improve the growth rate of amorphous silicon and yet produce high quality material in a manufacturable process.

Some prior art approaches attempt to improve the growth of amorphous silicon by modifying the power applied to create the plasma in the CVD chamber. For example, U.S. Pat. No. 5,648,293 is directed to a method of depositing amorphous silicon by utilizing an improved high frequency discontinuous discharge. Unfortunately, controlling the high frequency discontinuous discharge requires additional overhead and is more complex to monitor, thereby injecting inefficiencies into the manufacturing process. Furthermore, the discontinuous discharge can damage devices that are on the silicon substrate.

Some prior art approaches attempt to improve the quality of the films by designing specialized processing equipment (e.g., a re-design of the reactor and load-lock system). One such approach is described in the article, "Deposition of Ultrapure Hydrogenated Amorphous Silicon" by Toshihiro Kamei and Akihisa Matsuda. Unfortunately, not only are these approaches costly to design, but the complexity of the equipment can make the equipment more cumbersome to operate and maintain. As can be appreciated, requiring new specialized equipment that must be tested and validated for large quantity runs injects complexity and inefficiencies into the manufacturing process.

Based on the foregoing, it is clearly desirable to provide a method for efficiently depositing an amorphous silicon film.

SUMMARY OF THE INVENTION

It is an object of the present invention to provide a method of depositing a-Si:H layer or film on a silicon substrate at high deposition rates such that it can be suitably used in a manufacturing process.

It is another object of the present invention to provide a method of depositing a-Si:H layer or film on a silicon substrate at high deposition rates while producing films of superior quality suitable for use in a manufacturing process.

According to one embodiment, the present invention provides a method of depositing a layer of amorphous silicon film on a substrate at a very fast deposition rate while maintaining superior film quality. A plasma volume in a process chamber is defined. A total flow rate of a mixture of gases introduced into the chamber is also defined. The total flow rate is the sum of the flow rates of the respective gases in the mixture. Next, a process parameter that includes the plasma volume and total flow rate is defined. The process parameter is then maintained in a first predetermined relationship with a predetermined value during the deposition of the amorphous silicon film. By using the present invention, circuit devices (e.g., diodes or thin film transistors) of superior quality can be produced at very high efficiency in an active semiconductor layer of amorphous silicon. The processing method of the present invention can be applied whenever a layer (doped or non-doped) of amorphous silicon is needed.

According to another embodiment, the present invention is directed to a high quality amorphous silicon film that has elements of silicon and hydrogen, a smooth and glassy appearance when viewed at 50,000× magnification on a scanning electron microscope (SEM), and, when cleaved, a void-free morphology in the cross sectional view and plan views. The high quality amorphous silicon film of the present invention also has a density of states versus the depth in energy from the conduction edge of the bandgap plot substantially as shown in FIG. 5 and a photocapacitance versus photon energy graph substantially as shown in FIG. 6.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE PREFERRED EMBODIMENT

Figure 1:
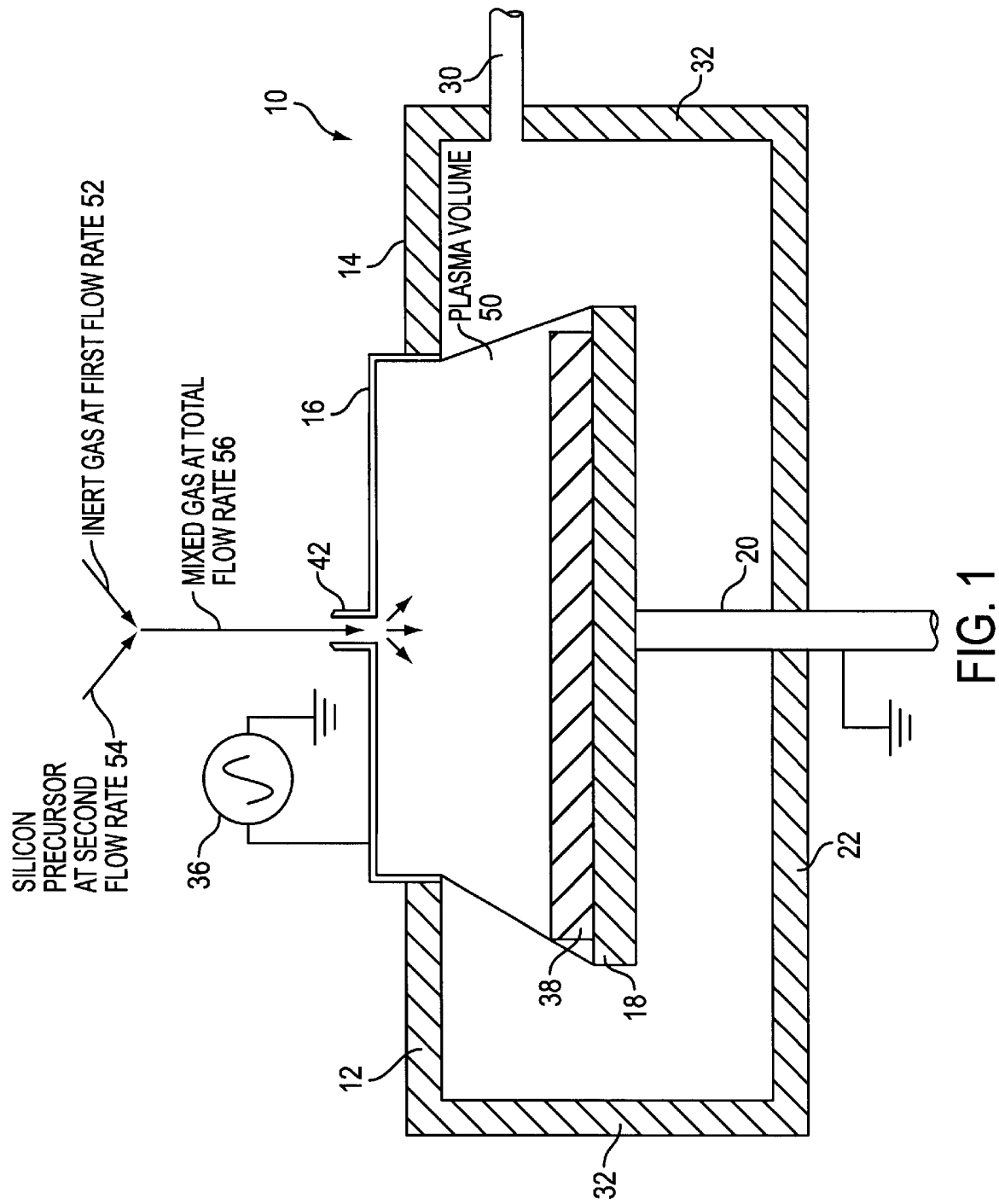
FIG. 1 is a schematic sectional view of a plasma-enhanced chemical vapor deposition chamber in which the method in accordance with the present invention can be carried out.

A high deposition rate method for forming an amorphous silicon layer and the resulting high quality a-Si:H layer are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

The inventors of the present invention have identified the following three factors that contribute to the problems encountered with the various prior art approaches to forming a-Si:H films at high deposition rates. First, there is a high rate of particle generation in the process chamber (e.g., a plasma-enhanced chemical vapor deposition (PECVD) chamber). Second, there is a high collision frequency between molecular fragments containing silicon which can lead to one source of particle generation. Third, these prior art approaches utilize low flow rates of silicon-containing precursors into the chamber, thereby increasing the number and rate of particles generated in the process chamber.

In response to these identified factors, the present invention provides a high deposition rate method for forming a-Si:H films and a resulting a-Si:H film that exhibits a low defect density. The present invention provides novel techniques and mechanisms to (1) reduce the number of particles generated in the chamber; and (2) to remove particles that have been generated in the chamber.

The present invention reduces the number of particles generated in the chamber by defining a novel processing parameter and enforcing the parameter in the process. This processing parameter relates to the plasma in the chamber and the flow rate of the gas provided into the chamber. First, the present invention defines a plasma volume in the chamber. Second, the present invention defines a flow rate of the gas entering the chamber. Third, the present invention specifies a process parameter (K) that defines a predetermined relationship between the plasma volume to pumping speed. The predetermined relationship can be the ratio between the plasma volume and the pumping speed (e.g., the flow rate of the gas).

In addition, the processing method of the present invention specifies a high flow rate of silicon-containing precursors with a low partial pressure of these silicon-containing precursors. Furthermore, the processing method of the present invention specifies a high plasma power to fragment the silicon-containing precursors efficiently. Last, the temperature of the wafer, the amount of hydrogen in the chamber, and the amount of hydrogen in the film are controlled by the present invention in order to produce a-Si:H material or film with minimum defect density.

The present invention also teaches the removal of particles generated in the chamber. The removal of particles can be accomplished by utilizing a process chamber that can be easily and readily cleaned or by using a self-cleaning chamber.

Plasma Reactor 10

Referring to FIG. 1, there is shown a schematic sectional view of a plasma-enhanced chemical vapor deposition (PECVD) apparatus 10 (referred to herein also as a plasma reactor 10) in which the method in accordance with the present invention can be performed. The apparatus 10 has a deposition chamber 12 which includes a top wall 14, side walls 32 and a bottom wall 22. The top wall 12 defines an opening therethrough. The apparatus 10 also has a first electrode or a gas inlet manifold 16 within the opening defined by the top wall 12. Alternatively, the top wall 14 can be solid with the electrode 16 being adjacent to the inner surface thereof. Within chamber 12 is a susceptor 18 in the form of a plate which extends parallel to the first electrode 16. The susceptor 18 can be connected to ground so that it serves as a second electrode. The susceptor 18 is mounted on the end of a shaft 20 which extends vertically through the bottom wall 22 of the deposition chamber 12. The shaft 20 is movable vertically so as to permit the movement of the susceptor 18 vertically toward and away from the first electrode 16.

A gas outlet 30 extends through the side wall 32 of the deposition chamber 12 and is connected to means (not shown) for evacuating the deposition chamber 12. A gas inlet pipe 42 extends through the first electrode or the gas inlet manifold 16 of the deposition chamber 12, and is connected through a gas switching network (not shown) to sources (not shown) of various gases. It is noted that more than one gas inlet 42 may be employed, and the gas inlet 42 may extend through one of the other walls of the chamber 12. The first electrode 16 is connected to an RF power source 36.

In the operation of the deposition apparatus 10, a substrate 38 (e.g., a silicon substrate) is first loaded into the deposition chamber 12 and is placed on the susceptor 18 by the transfer plate (not shown). A commonly used size for a silicon transistor substrate is approximately 100 mm by 300 mm. The susceptor 18 lifts the substrate 38 to position the substrate 38 relatively close to the first electrode 16. The preferred electrode spacing or the distance between the substrate surface and the discharge surface of the gas inlet manifold 16 is between about 250 to about 800 mils.

Process Flow

Figure 2:
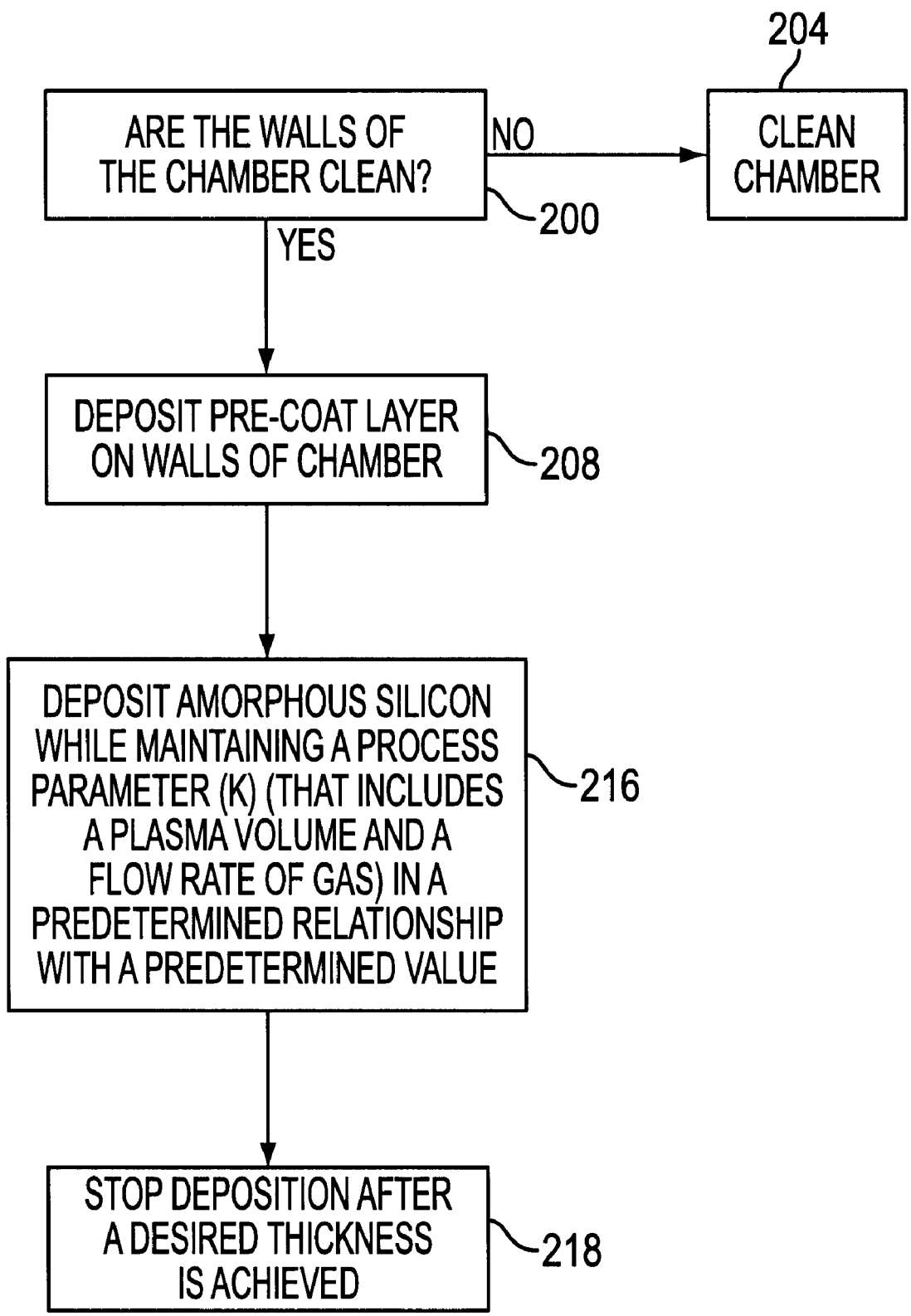
FIG. 2 is a flow chart illustrating the processing steps in accordance with one embodiment of the present invention.

FIG. 2 is a flow chart illustrating the processing steps in accordance with one embodiment of the present invention. At the start of the deposition process, the deposition chamber 12 is first evacuated through the gas outlet 30.

Monitoring Impurities

In step 200, a determination is made whether the walls of the chamber 12 are clean (e.g., do the walls have an unacceptable level of impurities). This level of impurities is predetermined and can vary across different processes and applications. Preferably, the level of impurities is limited to less than $10^{15}/cm^3$ or below the detectability by SIMS for most applications.

There are many well-known methods to determine if the walls of the chamber 12 have impurities. These impurities can include silicon residue or dopants (e.g., phosphorous, boron, aluminum, or arsenic). One such impurity detection method is to utilize secondary ion mass spectroscopy (SIMS). Another impurity detection method is to grow some film on the wall and examine the impurities therein.

If yes, in step 204, the walls of the chamber 12 are cleaned. After the cleaning step, processing then proceeds to step 208. If in step 200, it is determined that the level of impurities is at an acceptable level, the processing proceeds directly to step 208 without cleaning step 204.

Cleaning The Chamber

Preferably, the processing chamber can self-clean without leaving particles behind. An in-situ cleaning process of the interior of the chamber can be carried out after each deposition, when changing dopant type, or when particle generation may be at issue. The cleaning process effectively removes the contaminants and particles from the chamber walls that can be the source of unwanted impurities in the film. The frequency of such in-situ cleaning depends on many processing parameters which are determined in each deposition process.

Alternatively, a vacuum system can be coupled to the chamber to allow for vacuum transfer of wafers to a holding area so that the chamber may be cleaned without the wafer in it. For example, in such a system, the wafer can be moved in and out of the chamber several times.

Optional Pre-Coat Layer

In step 208, a pre-coat layer optionally can be deposited on the walls of the chamber 12. It is important to note that the wafer or substrate is not in the chamber 12 at this point in the process. The pre-coat layer, which can be a SiN film or $SiO_2$ film, is deposited on the walls of the chamber 12 by utilizing techniques that are well known in the art. For example, the introduction of nitrous oxide and silane through a plasma is effective for creating a $SiO_2$ film on the walls of the chamber 12. Similarly, the introduction of silane with nitrogen and/or ammonia through a plasma is effective for creating a SiN film on the walls of the chamber 12.

Inside deposition chamber 12, a substrate 38 (e.g., a silicon substrate) is then positioned on the susceptor 18. In step 216, amorphous silicon is deposited while maintaining a process parameter (K) in a predetermined relationship between a predetermined value. The process parameter (K) can include a plasma volume and a flow rate of gas into the chamber 12.

The deposition can be performed by creating a plasma with the plasma volume in the chamber subject to a process parameter (K). In the preferred embodiment, the process parameter (K) is a ratio of the plasma volume to the total flow rate of the mixture of gases, and the process parameter is maintained in a first predetermined relationship with a first predetermined ratio. Creating a plasma in the chamber 12 can include introducing gas, which can include a reactant gas and an inert gas into the chamber 12 at a total flow rate that is subject to the process parameter (K) (e.g., a plasma volume-to-flow rate ratio) and allowing the flow rate to stabilize.

The flow rate is the sum of the flow rates of all gases in the mixture 56 of gas. For example, consider a mixture of inert gas 52 at a first flow rate (Q1) and a reactant gas (e.g., a silicon pre-cursor 54) at a second flow rate (Q2). In this case, the total flow rate (Q_total) which is utilized to form the plasma volume-to-flow rate ratio is the sum of the flow rates of the gases that formed the mixture (i.e., Q_total= Q1+Q2). The flow rate is given in units of "sccm", which stands for "standard cubic centimeter per minute". As is well known in the art, standard temperature and pressure (STP) is 298° K. at 1 atm. Preferably, the reactant gas is a silicon-containing pre-cursor, that can be, but is not limited to, silane, disilane, trisilane, other halogenated silane, florinated silane, or dichlorosilane.

In one example, the flow rate of the inert gas is maintained at a high level in order to (1) move the silicon pre-cursor quickly through the plasma volume 50 to increase the silicon deposition rate, and (2) dilute the silicon pre-cursor. Preferably, the inert gas is one of the noble gases, such as helium (He), neon (Ne), argon (Ar), krypton (Kr), or xenon (Xe).

The step of creating a plasma also includes the step of applying power to the first electrode 16 to create the plasma near the wafer. The plasma has a plasma volume 50 that can be controlled by the amount of power applied. It is noted that the plasma is localized in the chamber and not diffuse. One method to determine the plasma volume 50 in a two parallel plate configuration is by visual inspection of the glow of the plasma and how far it extends in the chamber 12. The visually derived dimensions can then be utilized to calculate an estimate of the plasma volume 50. It is noted that other methods can be utilized and may be more suited for certain configurations.

One measure related to applying power to create a plasma in the chamber 12 is the power density. The power density is the amount of power applied divided by the area of the electrode over which the power is applied. In one embodiment of the present invention, the power density is preferably in the range of about 0.2 $W/cm^2$ to about 1 $W/cm^2$, but may be higher in other configurations. It is noted that in this case the power density employed by the present invention is much higher (about an order of magnitude higher) than conventional power density measures which typically range from 0.01 $W/cm^2$ to about 0.1 $W/cm^2$.

It is noted that the power can be first applied to the first electrode 16 and then the gas can be introduced into the chamber 12 to create a plasma or vis-versa.

Preferably, a process parameter (K) (e.g., a plasma volume to flow rate ratio) of less than 3 s is utilized. It is also believed that a plasma volume to flow rate ratio of less than 9 s would also yield a good quality film.

The mean transit time is the average time needed for a gas molecule to travel through the plasma region (e.g., the region from the injector to outside the glow region). Preferably, the mean transit time for the process of the present invention is less than 1.5 s. In one embodiment, the mean transit time of approximately 0.5 s provides good process results.

It is noted that the values and ranges of the various parameters described above may vary and depend on the specific process chamber or reactor design and the configuration of the process equipment utilized.

In step 218, the deposition is stopped after a desired film thickness is achieved. For example, the plasma can be stopped by shutting off the power after a particular thickness of the a-Si:H is achieved. It is noted that an alternative way to stop the plasma is to shut off the supply of reactant gas (e.g., the silicon containing precursor).

Since the deposition rate is known, after a predetermined amount of time, the deposition can be stopped. Preferably, a measuring device, such as a deposition rate monitor, can be employed to measure the thickness of the a-Si:H film, and the power can be shut-off after a predetermined thickness has been achieved. Alternatively, a quartz balance can be utilized for measuring the thickness of the a-Si:H film.

After the processing, the chamber 12 can be vented, and the wafer removed from the chamber 12. Alternatively, in a load-lock system the wafer can be transferred directly to an evacuated chamber for further processing after step 218.

Growth Conditions

In the described embodiments of the present invention, high quality a-Si:H films are achieved by depositing gas (e.g., a mixture of silicon pre-cursor and inert gas) while maintaining the pressure in the CVD chamber at between about 2 to about 9 Torr, and the substrate setpoint temperature at about 225 degrees to 330 degrees Celsius.

Figure 4:
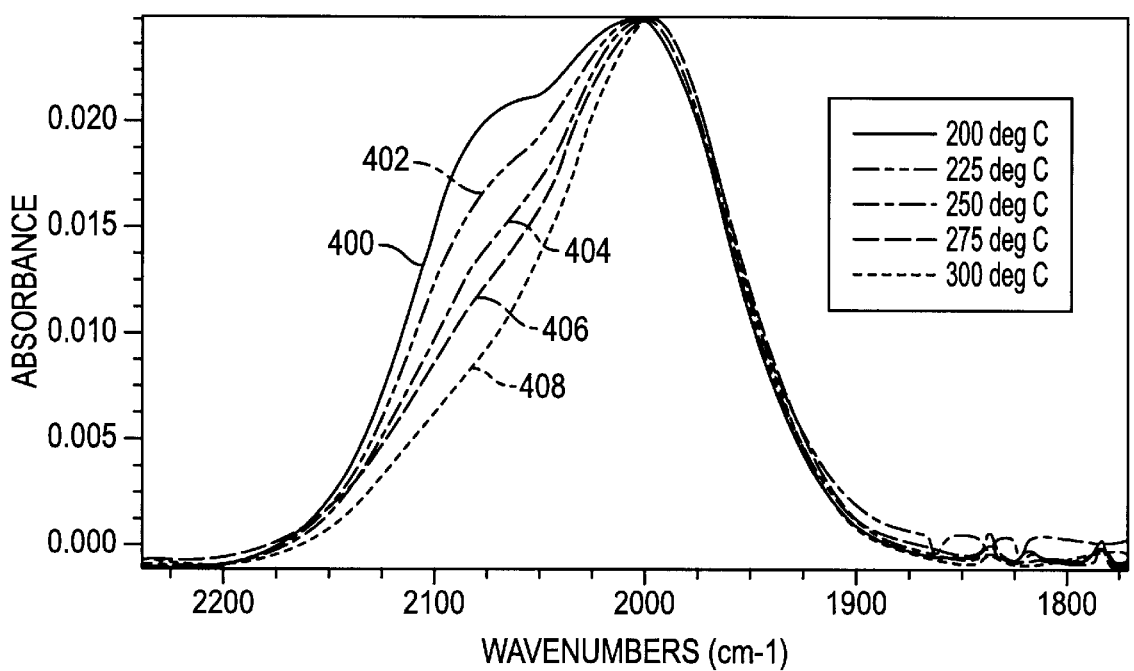
FIGS. 4 is an infrared spectrum plot of the amorphous silicon film manufactured in accordance with one embodiment of the present invention.

As is well known in the art, the actual temperature of the substrate is different from the setpoint temperature and typically may be about 30 degrees less than the setpoint temperature. A preferred way to establish the deposition temperature is to grow material or film at several different temperatures and obtain an infrared spectrum plot (e.g., the FTIR spectrum plot of FIG. 4). Referring to FIG. 4, the temperature is determined by maximizing the amount of total hydrogen, but at the same time minimizing the shoulder or peak at 2100 $cm^{-1}$.

Gas flow rates are regulated to maintain adequate reactant gas levels and in accordance with the processing parameter (K) that relates plasma volume with the flow rate. Preferably, silane at between 150 and 300 sccm and Argon at between 3000 and 7000 sccm are employed to deposit a-Si:H film on the substrate. A suitable thickness of the a-Si:H film is between about 10 nm to 2000 nm. The preferred processing conditions for the deposition of the a-Si:H film is shown below in Table I.

TABLE I

| a-Si:H Processes | Range of Conditions | Specific Conditions |
|---|---|---|
| SiH$_4$ Flow (sccm) | 150 to 300 | 150 |
| Pressure (Torr) | 2 to 9 | 5 |
| Ar Flow (sccm) | 3000 to 7000 | 3200 |
| RF Power (W) | 50 to 150 | 75 |
| Substrate Setpoint Temperature (degrees C.) | 225 to 330 | 300 |
| Electrode Spacing (mils) | 250 to 800 | 350 |

Decreasing Particle Formation

When the pump speed (S) is increased, the gas spends a minimum time in the plasma, thereby decreasing the formation of particles that may fall onto the silicon wafer or attach onto the walls of the chamber.

The following expression provides a relationship between the flow rate, pump speed and pressure that are utilized in the present invention:

$$Q=S*P$$

where Q is the flow rate, S is the pump speed, and P is the pressure.

The deposition rate (also referred to herein as the "dep. rate") is usually proportional to the flow rate (Q). In the prior art, it was thought that in order to deposit a high quality material, the dep. rate had to be kept low. Since the dep. rate is usually proportional to the flow rate (Q), it was thought that in order to deposit a high quality amorphous silicon layer, the flow rate (Q) must be kept low as well.

For a further discussion of film growth mechanisms, please refer to K. Tanak, "Glow Discharge Hydrogenated Amorphous Silicon, "Chapter 2: Deposition Process and Growth Mechanism", Kluwer Academic Publishers, Boston (1989).

In contrast, the present invention increases the flow rate (Q), thereby increasing the deposition rate while maintaining the quality of the resultant product. For systems, where it is desirable to keep a constant pressure, the present invention increases the pumping speed S) as well. The other steps of the method of the present invention, such as a localized low-energy plasma and cleaning of the chamber, address the particle generation issue, and produce a high quality layer of amorphous silicon.

The a-Si:H film that is produced by the process of the present invention has a deposition rate of at least 25 Angstroms per second across the wafer and has a defect density of no more than $1.3 \times 10^{16}$ $cm^{-3}$. It is noted that defect densities of $2 \times 10^{15}$ $cm^{-3}$ to $3 \times 10^{15}$ $cm^{-3}$ may be achieved by the process of the present invention. Also, deposition rates of 30 to 40 Angstroms per second have been achieved by the present invention. It is believed that as higher pumping speeds are utilized, the defect density can be further reduced.

In one embodiment, the amorphous silicon film is deposited by a chemical vapor deposition process conducted at a high deposition rate being selected from the respective range of between 25 and 40 Angstroms/s. The processing method of the present invention specifies a small plasma volume to pumping speed ratio, utilizes a CVD chamber that can be easily and readily cleaned, specifies a high flow rate of silicon-containing precursors with a low partial pressure of these silicon-containing precursors, and specifies a high plasma power to fragment the silicon-containing precursors efficiently.

It is noted that the above-described method for depositing non-doped amorphous silicon is equally applicable to doped films of amorphous silicon. For example, it may be desirable in certain applications to form doped films of n-type or p-type regions. For example, doped amorphous silicon (e.g., diborane or phosphine) can be formed by adding boron-containing or phosphorous-containing gases. The method of depositing the amorphous silicon can be applied to these doped films with the same benefits described above. In these cases, the processing equipment can include a mechanism to flow controlled amounts of gases containing dopant atoms to be incorporated in the doped film. These dopants include, but are not limited to, the following: B, Al, Ga, In, C, Sn, Ge, Pb, P, N, As, Sb, Ti, Bi, Se, S, Te, and O. The doped silicon film can then be made under similar process conditions as described above with the addition of small amounts of dopant.

Signature of the Hydrogenated Amorphous Silicon

The hydrogenated amorphous silicon manufactured in accordance with one embodiment of the present invention can be identified by utilizing one or more measurements of the properties of the hydrogenated amorphous silicon. These properties are now described with reference to FIGS. 3–6.

Figure 3:
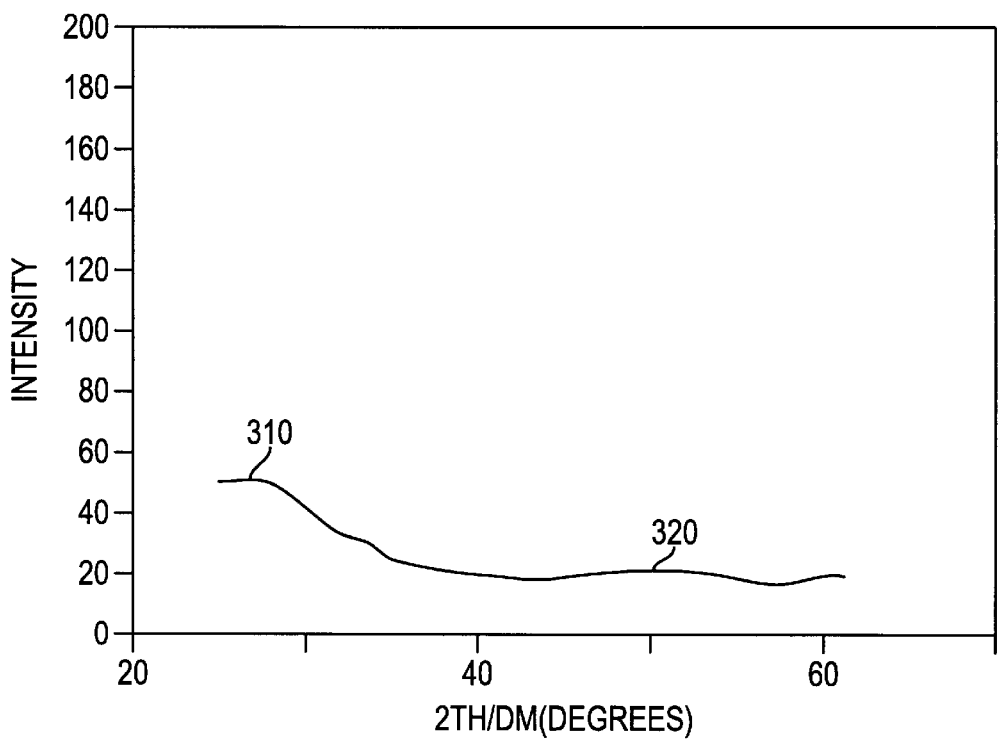
FIG. 3 is an x-ray diffractometer plot of the amorphous silicon film manufactured in accordance with one embodiment of the present invention.

FIG. 3 is an x-ray diffractometer plot of the hydrogenated amorphous silicon manufactured in accordance with one embodiment of the present invention. The measurement set-up to obtain this plot is well-known by those of ordinary skill in the art and includes an x-ray source for generating and directing an x-ray beam at a sample (i.e., material under measurement) and a detector positioned to receive x-rays that are diffracted from the sample. The vertical axis represents a relative intensity that may be expressed in any arbitrary units. The intensity is a relative measure of the number of x-rays that received by the detector. The horizontal axis represents the angle formed by the incoming x-ray beam and the x-ray beam diffracted by the sample. The angle is given in units of two-theta. It is noted that there is a peak 310 at approximate 27 degrees, and a harmonic 320 thereof at approximately 54 degrees, which is one unique signature of the amorphous silicon layer deposited by the method of the present invention. The peak 310 represents the amorphous band that shows scattering based on average Si—Si atom spacing. The x-ray diffractometry does not detect a significant fraction of crystalline material.

FIG. 4 is an infrared spectrum plot of the hydrogenated amorphous silicon manufactured in accordance with one embodiment of the present invention. In the FTIR plot there are five plots where each plot corresponds to a different temperature (e.g., setpoint temperatures from 200 to 325 degrees Celsius in 25-degree increments). The measurement set-up to obtain this plot is well-known by those of ordinary skill in the art and includes an infrared source for generating and directing an infrared light at a sample (i.e., the material under measurement) and a detector positioned to receive infrared light that passes through the sample. The horizontal axis represents a wave number, which is a relative measure that simply is the inverse of the wavelength of the incident infrared light. The vertical axis represents the absorbance (i.e., a measure of the amount of light that does not pass through the material.

Once the processing conditions have been set as described above, the infrared spectrum curves of FIG. 4 can be utilized to optimize the processing temperature for the material by improving the structure of the a-Si:H. FIG. 4 illustrates five curves that correspond to five different temperatures. A first curve 400 corresponds to 300 degrees Celsius. A second curve 402 corresponds to 275 degrees Celsius. A third curve 404 corresponds to 250 degrees Celsius. A fourth curve 406 corresponds to 225 degrees Celsius. A fifth curve 408 corresponds to 200 degrees Celsius. There is an infrared absorption peak at approximately 2000 $cm^{-1}$ for the curves (400 to 408). The first curve 400 and the second curve 402 exhibit a slight shoulder at approximately 2100 $cm^{-1}$.

It is generally known that by selectively modifying the substrate temperature, the number of hydrogen atoms can be increased or decreased to achieve an optimal number of hydrogen atoms. The optimal condition is when the number of hydrogen atoms closely matches the number of dangling bonds in the silicon. When there is an excessive number of hydrogen atoms (i.e., the substrate temperature is too high), the infrared spectrum plot exhibits a shoulder (e.g., curves 400 and 402). Preferably, the a-Si:H material of the present invention features an infrared spectrum plot of either the fourth curve 406 (225 degrees Celsius) or the fifth curve 408 (200 degrees Celsius) that both do not exhibit a shoulder, thereby indicating that the number of hydrogen atoms closely matches the number needed to bond with the dangling bonds of the silicon. As described previously, the preferred manner of determining the process temperature is through the use of infrared spectrum plot of FIG. 4.

The a-Si:H deposited film manufactured by the processing method of the present invention has a smooth and glassy appearance when viewed at 50,000× magnification on a scanning electron microscope (SEM). When cleaved, the cross sectional view and plan view of the a-Si:H deposited film manufactured by the processing method of the present invention reveal a void-free morphology.

Figure 5:
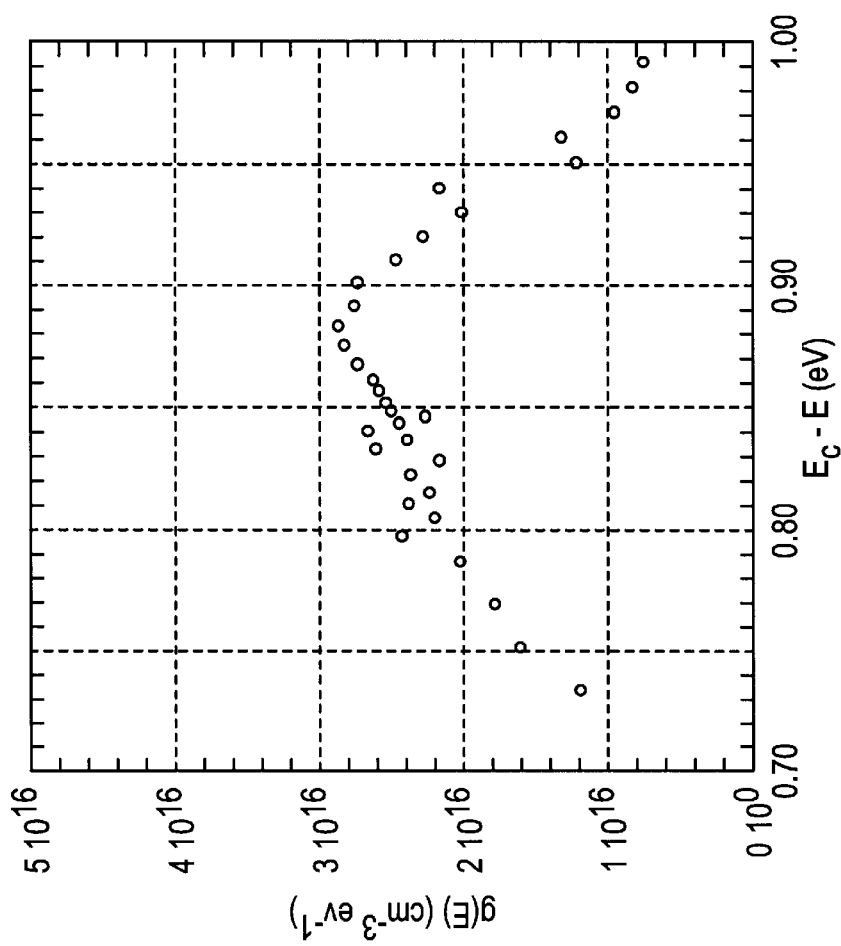
FIG. 5 illustrates a density of states versus the depth in energy from the conduction edge of the bandgap plot of an amorphous silicon film manufactured in accordance with the processing method of the present invention.

FIG. 5 illustrates a density of states versus the depth in energy from the conduction edge of the bandgap plot (referred to herein as the density of states plot) of the hydrogenated amorphous silicon manufactured in accordance with one embodiment of the present invention. This density of states plot provides a fingerprint of the hydrogenated amorphous silicon of the present invention. The density of states plot indicates the quality of the material and generally reveals the extent of leakage of devices that are manufacture in the film. This plot also indicates the extent of dangling bond defects, which can contribute to leakage, and is an indicator of quality of the material. It is noted that the integrated DOS is less than about $6 \times 10^{15}$ $cm^{-3}$. Also, there is a mid-gap peak at about 0.88 eV from the conduction band edge, and there is a second peak at about 0.83 eV. The band-gap is about 1.84 eV. The thermal carrier generation activation energy ($E_a$) is about 0.9 eV, and the Urbach energy ($E_U$) is about 56 meV.

Please refer to "Mid-gap States Measurement of Low-level B-doped a Si:H films", written by J. Theil, D. Lefforge, G. Kooi, M. Cao, and G. Ray, and published in the 18$^{TH}$ ICAMS Proc., J. Non-crystalline Solids, which is incorporated by reference herein, for a description of one technique to generate the DOS plot.

Figure 6:
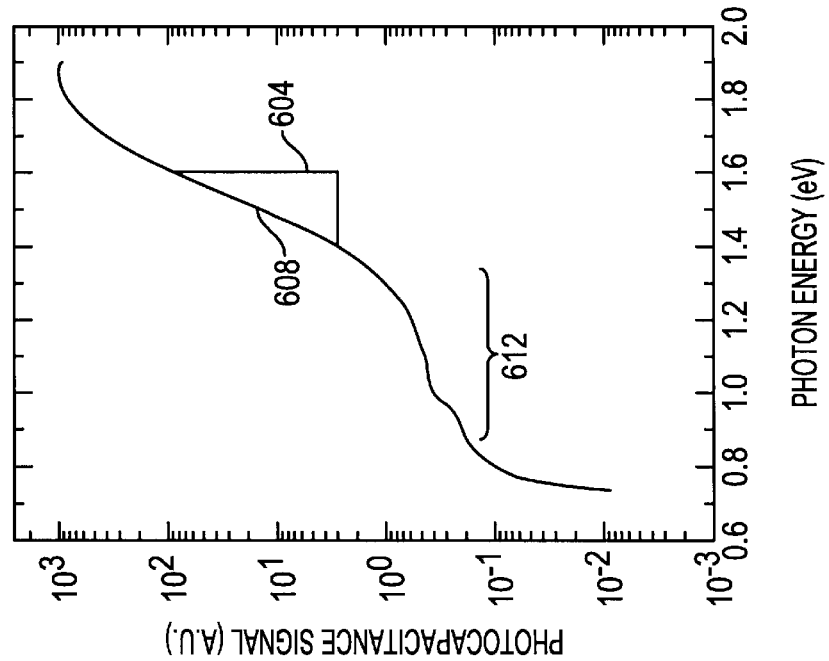
FIG. 6 is a photocapacitance versus photon energy graph of an amorphous silicon film manufactured in accordance with the processing method of the present invention.

FIG. 6 is a photocapacitance versus photon energy graph of the hydrogenated amorphous silicon manufactured in accordance with one embodiment of the present invention. The slope 604 of the straight portion 608 of the curve represents density of states (DOS) along the valence band edge. The slope 604 and the shoulder 612 that is defined between approximately 0.8 eV and 1.4 eV provide a signature of a-Si:H film manufactured by the process of the present invention. The slope 604 of the steep portion of the a-Si:H film manufactured by the process of the present invention indicates that the film has more order in the atomic structure of the film than a material having a higher slope. The increased order improves mobility (i.e., there is less stored charge), thereby lowering the capacitance in the film. As the capacitance of the film is lowered, the faster devices manufactured therein exhibit a faster response (i.e., the speed of the devices increases). It is noted that the lower the slope of the steep portion, the lower the degree of disorder in the material, thereby indicating a higher quality material. In one embodiment of the present invention, the slope of the steep portion is about 56 meV. In contrast, low quality materials have a much higher slope of about 70 to 80 meV indicating greater disorder.

In summary, the a-Si:H film that is manufactured with the process described hereinabove can be uniquely identified by FIGS. 3 to 6. These plots or graphs provide a unique signature of the a-Si:H so that when these measurements are taken for a given sample material, a determination may be made whether the sample material is the a-Si:H manufactured by the process of the present invention.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A method of depositing an amorphous silicon film comprising the steps of:

defining a plasma volume in a process chamber;

defining a total flow rate of a mixture of gases introduced into the process chamber, the mixture of gases including a silicon containing precursor; wherein the total flow rate is the sum of the flow rates of the respective gases in the mixture;

defining a process parameter that is a ratio of plasma volume to the total flow rate; and maintaining the process parameter in a predetermined relationship with a predetermined value during the deposition of the amorphous silicon film.

2. The method of claim 1 wherein the step of defining the process parameter that includes the plasma volume and total flow rate includes defining the process parameter to be a ratio of the plasma volume to the total flow rate; and wherein the step of maintaining the process parameter in a predetermined relationship with a predetermined value during the deposition of the amorphous silicon film includes maintaining the ratio of the plasma volume to the total flow rate to be less than a predetermined ratio.

3. The method of claim 1 wherein the amorphous silicon film is deposited by a chemical vapor deposition process and wherein the deposition rate is at least 25 Angstroms/s.

4. The method of claim 3 wherein a mean transit time is defined as the average time needed for a gas molecule to travel through a plasma region; and wherein the mean transit time is less than 1.5 seconds.

5. The method of claim 3 wherein a mean transit time is defined as the average time needed for a gas molecule to travel through a plasma region; and wherein the mean transit time is approximately 0.5 seconds.

6. The method of claim 1 wherein the amorphous silicon film has a defect density of no more than $1.3 \times 10^{16}$ cm$^{-3}$.

7. The method of claim 1 further comprising:

maintaining a pressure in the process chamber at between about 2 Torr to about 9 Torr;

wherein in the step of maintaining the process parameter in a predetermined relationship with a predetermined value during the deposition of the amorphous silicon film includes maintaining a flow rate of a reactant gas at between 150 and 300 sccm;

maintaining a flow rate of a noble gas at between about 3000 sccm and about 7000 sccm; and maintaining a power density in the range of about 0.2 W/cm$^2$ to about 1 W/cm$^2$.

8. The method of claim 1 wherein the amorphous silicon film is deposited on a silicon substrate.

9. The method of claim 1 wherein the amorphous silicon is a-Si:H film.

10. The method of claim 9 wherein the a-Si:H film is a non-doped a-Si:H film.

11. The method of claim 9 wherein the a-Si:H film is a doped a-Si:H film.

12. A method of growing amorphous silicon in a chamber having walls comprising:

(a) determining if the chamber walls are clean;

(b) if no, performing a self-clean of the chamber walls that utilizes an in-situ cleaning process; and (c) if yes, creating a plasma having a plasma volume in the chamber; wherein creating the plasma includes the step of introducing a reactant gas into the chamber at a flow rate; wherein the ratio of the plasma volume to the flow rate of the reactant gas is maintained in a predetermined relationship with a predetermined ratio.

13. The method of claim 12 further comprising the steps of:

after step (b), transferring a wafer into the chamber;

prior to the step of transferring a wafer into the chamber, depositing a pre-coat layer on the chamber walls.

14. A method of growing amorphous silicon in a chamber having walls comprising:

(a) determining if the chamber walls are clean;

(b) if no, performing a self-clean of the chamber walls that utilizes an in-situ cleaning process; and (c) if yes, introducing a reactant gas into the chamber at a flow rate; and (d) applying power between a first electrode and a second electrode to create a plasma in chamber, the plasma having a plasma volume;

wherein the flow rate and the applied power are maintained so that the ratio of the plasma volume to the flow rate is in a predetermined relationship with a predetermined ratio.

15. The method of claim 14 further comprising the step of:

after step (b), transferring a wafer into the chamber;

prior to the step of transferring a wafer into the chamber, depositing a pre-coat layer on the chamber walls.

16. A method of depositing an amorphous silicon film comprising the steps of:

defining a plasma volume in a process chamber;

defining a total flow rate of a mixture of gases introduced into the process chamber, the mixture of gases including a silicon containing precursor; wherein the total flow rate is the sum of the flow rates of the respective gases in the mixture;

defining a process parameter that is a ratio of plasma volume to the total flow rate;

maintaining the process parameter in a predetermined relationship with a predetermined value during the deposition of the amorphous silicon film;

maintaining a flow rate of the silicon containing precursor in a first predetermined range of values; and maintaining a process pressure in a second predetermined range of values; and maintaining a power level in a third predetermined range of values.

17. The method of claim 16 wherein the step of maintaining a process pressure in a second predetermined range of values includes the step of maintaining a process pressure between about 2 Torr and about 9 Torr.

18. The method of claim 16 wherein the step of maintaining a power level in a third predetermined range of values includes the step of maintaining a power level of between about 50 Watts to about 150 Watts.

19. The method of claim 16 wherein the step of maintaining a flow rate of the silicon containing precursor in a first predetermined range of values includes the step of maintaining a flow rate of a silicon containing precursor between about 150 sccm to about 300 sccm.

20. The method of claim 16 further comprising the step of:

maintaining the total flow rate of a mixture of gases between about 3000 sccm to about 7000 sccm.

21. The method of claim 16 further comprising the step of:

maintaining a mean transit time that is an average time needed for a gas molecule to travel through the plasma volume to be less than or equal to 1.5 seconds.

* * * * *